United States Patent
Carlson et al.

(10) Patent No.: US 10,579,515 B1
(45) Date of Patent: Mar. 3, 2020

(54) RECYCLING SEGMENT PAGES WHILE PRESERVING INTEGRITY OF MEMORY ADDRESSING

(71) Applicant: International Business Machines Corporation, Armonk, NY (US)

(72) Inventors: David G. Carlson, Rochester, MN (US); Kevin C. Griffin, Stewartville, MN (US); William A. Brown, Pine Island, MN (US); Thomas P. Giordano, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/126,601

(22) Filed: Sep. 10, 2018

(51) Int. Cl.
| | |
|---|---|
| *G06F 9/50* | (2006.01) |
| *G06F 12/02* | (2006.01) |
| *G06F 12/109* | (2016.01) |
| *G06F 3/06* | (2006.01) |
| *G11C 29/52* | (2006.01) |

(52) U.S. Cl.
CPC ........ *G06F 12/0238* (2013.01); *G06F 3/0619* (2013.01); *G06F 3/0638* (2013.01); *G06F 3/0673* (2013.01); *G06F 9/5016* (2013.01); *G06F 12/109* (2013.01); *G11C 29/52* (2013.01)

(58) Field of Classification Search
CPC .. G06F 12/0238; G06F 3/0619; G06F 3/0638; G06F 3/0673; G06F 9/5016
USPC .......................................................... 711/170
See application file for complete search history.

(56) References Cited

U.S. PATENT DOCUMENTS

| | | | |
|---|---|---|---|
| 5,173,872 A | 12/1992 | Crawford et al. | |
| 5,249,231 A | 9/1993 | Covey et al. | |
| 8,782,011 B2 | 7/2014 | Guo | |
| 8,904,137 B1 | 12/2014 | Zhang et al. | |
| 2003/0028723 A1* | 2/2003 | Segev | G06F 11/2071 711/113 |
| 2004/0117398 A1* | 6/2004 | Idei | G06F 12/0862 |
| 2007/0005660 A1* | 1/2007 | Idei | G06F 12/0862 |
| 2009/0100223 A1 | 4/2009 | Murayama et al. | |
| 2012/0005202 A1* | 1/2012 | Bostick | G06F 17/2229 707/730 |
| 2012/0095957 A1* | 4/2012 | Reddy | G06F 16/256 707/602 |

(Continued)

OTHER PUBLICATIONS

Shenoy. (2008). Segmented Paging. Computer Science course, University of Massachusetts.

(Continued)

*Primary Examiner* — Than Nguyen
(74) *Attorney, Agent, or Firm* — Patterson + Sheridan, LLP

(57) ABSTRACT

Techniques for recycling segment pages while preserving integrity of memory addressing. Upon a request to delete a system object, an initial segment identifier is de-assigned from a segment of the system object, and each segment page of the system object is remapped to a new virtual address range. The segment is stored as a reusable segment in a reusable segment store. Upon a request to access the system object, an exception is raised that the system object does not exist. Upon a request to create a new system object, the reusable segment store is searched to identify the reusable segment as a match. The reusable segment is assigned as a segment of the new system object.

20 Claims, 6 Drawing Sheets

(56) References Cited

U.S. PATENT DOCUMENTS

2015/0149692 A1* 5/2015 Wang ................. G06F 12/0253
                                                                711/103
2017/0147260 A1    5/2017 Byun

OTHER PUBLICATIONS

Combined Paging and Segmentation. (2012). LinkedIn SlideShare. Retrieved from: https://www.slideshare.net/Tech_MX/combined-paging-and-segmentation.
Amir, Y. Operating Systems 600.418 Memory Management. Department of Computer Science, Johns Hopkins University, 42-43. Retrieved from: http://www.cs.jhu.edu/~yairamir/cs418/os5/sld042.htm.

* cited by examiner

RECYCLING SEGMENT PAGES WHILE PRESERVING INTEGRITY OF MEMORY ADDRESSING

BACKGROUND

Embodiments presented in this disclosure relate to memory management techniques. More specifically, embodiments disclosed herein relate to techniques for improving system efficiency by recycling segment pages while preserving integrity of memory addressing in an execution environment provided by an operating system.

In modern data processing systems, or computers, an operating system manages the distribution of system resources to one or more executing software applications. A fundamental component of operating systems is the operating system kernel, which provides software applications with secure access to the system resources. Processes running in user space do not have permission to utilize system resources on their own. Operating systems provide entry points through system calls, which may be implemented using software interrupts, that allow user-space processes to request services from the kernel. Thus, these processes make predefined calls to the operating system to request resources from the operating system. The processes may be configured to make calls directly or by making calls to an application program interface (API) that implements system calls. System calls and API calls may be implemented differently on various operating systems or on different versions of the same operating system.

SUMMARY

One embodiment includes a computer-implemented method of implementing selectivity in allocating and de-allocating system objects, without compromising integrity of virtual memory accesses. The computer-implemented method includes receiving, from an application, a request to delete a first system object having a segment identifiable via an initial segment identifier. The segment includes one or more segment pages, and each of the one or more segment pages is mapped to a respective, initial virtual address range. The computer-implemented also includes de-assigning, responsive to the request, the initial segment identifier from the segment and assigning a new segment identifier to the segment, without de-allocating the first system object. Each segment page is remapped to a respective, new virtual address range, and the segment is stored as a reusable segment in a reusable segment store. The computer-implemented method also includes, upon receiving a request to create a second system object, the request specifying one or more desired attributes for the second system object, searching the reusable segment store in order to identify a match satisfying the one or more desired attributes, the match comprising the reusable segment. The computer-implemented method also includes assigning the reusable segment as a segment of the second system object and by operation of one or more computer processors.

Another embodiment includes a computer program product to implement selectivity in allocating and de-allocating system objects, without compromising integrity of virtual memory accesses. The computer program product includes a computer-readable storage medium having computer readable program code embodied therewith. The computer readable program code is executable by one or more computer processors to perform an operation that includes providing one or more system objects including a first system object. Each of the one or more system objects has a respective segment that is identifiable via an initial segment identifier, the respective segment including one or more segment pages. Each of the one or more segment pages is mapped to a respective, initial virtual address range. The operation also includes, upon receiving, from an application, a request to delete the first system object, de-assigning the initial segment identifier from the segment and assigning a new segment identifier to the segment, without de-allocating the first system object. Each segment page is remapped to a respective, new virtual address range, and the segment is stored as a reusable segment in a reusable segment store. The operation also includes, upon receiving a request to access the first system object, raising an exception that the first system object does not exist, based on at least one of the initial segment identifier being de-assigned and the initial virtual address range being unmapped. The operation also includes, upon receiving a request to create a second system object, the request specifying one or more desired attributes for the second system object, searching the reusable segment store in order to identify a match satisfying the one or more desired attributes, the match comprising the reusable segment. The operation also includes assigning the reusable segment as a segment of the second system object, whereby the reusable segment is reused by the second system object. The second system object is accessed by the application, thereby avoiding a processing overhead associated with de-allocating the first system object and allocating the second system object, while maintaining integrity of virtual memory accesses of the system objects.

Still another embodiment includes a system to implement selectivity in allocating and de-allocating system objects, without compromising integrity of virtual memory accesses. The system includes one or more computer processors and a memory program a program which, when executed by one or more computer processors, performs an operation that includes providing one or more system objects including a first system object. Each of the one or more system objects has a respective segment that is identifiable via an initial segment identifier, the respective segment including one or more segment pages. Each of the one or more segment pages is mapped to a respective, initial virtual address range. The operation also includes, upon receiving, from an application, a request to delete the first system object, de-assigning the initial segment identifier from the segment and assigning a new segment identifier to the segment, without de-allocating the first system object. Each segment page is remapped to a respective, new virtual address range, and the segment is stored as a reusable segment in a reusable segment store. The operation also includes, upon receiving a request to access the first system object, raising an exception that the first system object does not exist, based on at least one of the initial segment identifier being de-assigned and the initial virtual address range being unmapped. The operation also includes, upon receiving a request to create a second system object, the request specifying one or more desired attributes for the second system object, searching the reusable segment store in order to identify a match satisfying the one or more desired attributes, the match comprising the reusable segment. The operation also includes assigning the reusable segment as a segment of the second system object, whereby the reusable segment is reused by the second system object. The second system object is accessed by the application, thereby avoiding a processing overhead associated with de-allocating the first system object and allocating the second system object, while maintaining integrity of virtual memory accesses of the system objects.

DETAILED DESCRIPTION

Figure 1:
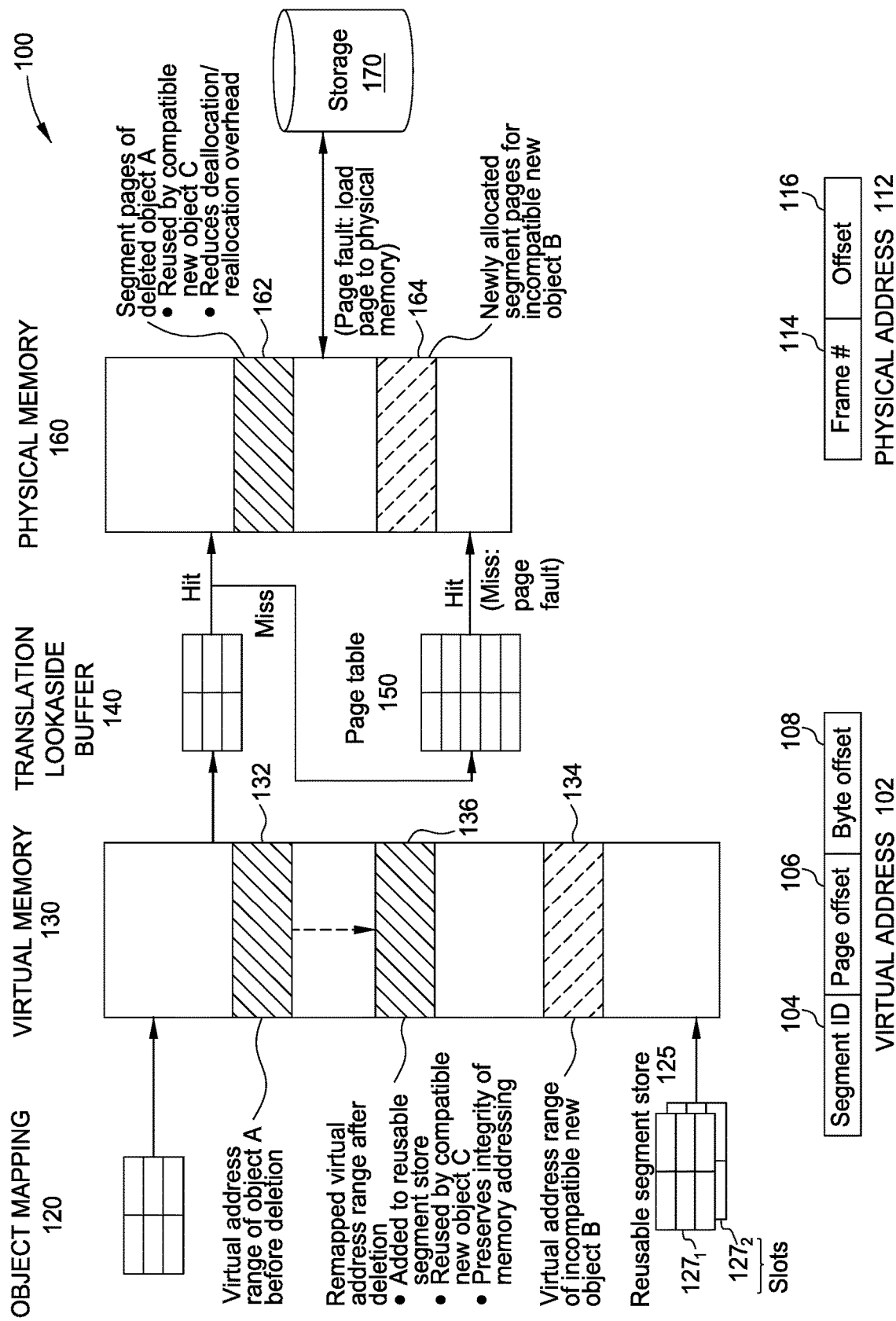
FIG. 1 is a functional block diagram depicting recycling of segment pages while preserving integrity of memory addressing, according to one embodiment presented in this disclosure.

Embodiments presented in this disclosure provide techniques for recycling segment pages while preserving integrity of memory addressing. Referring to FIG. 1, a functional block diagram 100 depicting the recycling of segment pages while preserving integrity of memory addressing according to one embodiment is shown. The functional block diagram 100 includes a storage 170, physical memory 160 addressable via physical address 112, and virtual memory 130 addressable via virtual address 102. In a particular embodiment, the virtual address 102 includes a segment identifier 104 and an offset that includes both a page offset 106 and a byte offset 108, whereas the physical address 112 includes a frame number 114 and an offset 116. The segment identifier 104 and the page offset 106 together can be referred to as a virtual page number of the virtual address.

At least in some embodiments, the techniques presented herein are performed by an operating system that implements memory management by virtualizing memory units of a computer as the virtual memory 130, to permit applications to access the memory units as if there was a single, contiguous hardware memory unit. In some embodiments, the operating system includes a kernel that, due to the complexities involved in accessing hardware, implements a set of hardware abstractions to provide a uniform interface to the underlying hardware, thereby simplifying software application development. The operating system can segregate virtual memory into user space, which is designated for executing user applications, and kernel space, which is reserved for running the kernel and extensions to the kernel.

In some embodiments, the kernel can include a virtual memory manager component configured to maintain a subset of secondary storage space on the storage 170 for temporarily storing content that the physical memory 160 is currently insufficient or otherwise unavailable to store. The subset of secondary storage space is referred to as paging space. The virtual memory manager swaps content from the physical memory 160 to the paging space in the storage 170 when the content is not in use. The virtual memory manager also swaps content from the paging space in the storage 170 back into the physical memory 160 when the content is once again in use. The content can be read to or written from the paging space in the form of blocks of contiguous paging space, also referred to as pages.

In this way, the memory management, also referred to as virtual memory management, permits total memory content of processes executing on a computer to exceed the total physical memory and further permits the processes to use the physical memory 160 only when the processes are actually executing. The operating system can attempt to free up, or deallocate, pages from the processes before the operating system runs out of available memory, to avoid deadlocks that can cause the operating system to crash. For instance, the operating system can maintain operating system stability by terminating a process to which an excessive number of pages are allocated.

At least in some embodiments, the operating system provides a virtual instruction set that is independent of an underlying machine instruction set supported by one or more computer processors of the system. The virtual instruction set can be implemented via microcode components of the operating system and can be referred to as a technology-independent machine interface or virtual-machine interface. Applications using the technology-independent machine interface can be insulated from changes to the underlying processor architecture, such as those resulting from advances in processor design. In one embodiment, applications written in a high-level programming language are compiled to the virtual instruction set and then further compiled to the underlying machine instruction set. In an alternative embodiment, the applications are compiled to the virtual instruction set and then interpreted to generate and execute machine instructions.

In some embodiments, the operating system supports a set of hardware-dependent system objects and further supports, via the technology-independent machine interface, a separate set of hardware-independent system objects defined at a higher abstraction layer to support technology independence. Each hardware-independent system object can map to one or more corresponding, hardware-dependent system objects. The virtual instruction set uses different types of system objects logically defined by the technology-independent machine interface.

One example of a type of hardware-independent system object is a space, which contains a chunk of bytes; such an object is defined logically (as a chunk of bytes) rather than via explicit references to physical memory or registers. Other types of hardware-independent system objects include a data space, a data space index, and a cursor. In some embodiments, the system provides a database and includes a database management system running in an execution environment provided by the operating system. Depending on the embodiment, some or all of the database management system can be integrated into the operating system itself. The database can use a data space to store physical data and field definitions for database records. The data space index provides a definition of a logical view of the data. The cursor provides access to the database records in the data space and further provides the logical view using the data space index. The space stores results of any database operations.

At least in some embodiments, each hardware-independent system object includes a function portion and a space portion, which are stored in separate segments of virtual memory space—with the exception of a space, which contains a space portion and no functional portion. Each segment contains one or more pages, and the segment size can vary based on application needs. For instance, in a particular embodiment, a segment can occupy four pages with an individual page size of four kilobytes. Each hardware-independent system object includes a base segment and optionally includes one or more secondary segments. Each segment can include a segment header containing attributes such as segment type, segment permanence, whether additional pages can be allocated as needed, whether the segment contains system pointers, count of allocated pages, base segment location, and next secondary segment location.

In one embodiment, system objects can be designated as temporary or permanent via an object permanence attribute, also referred to herein as a segment permanence attribute. Permanent objects persist until explicitly destroyed; such objects persist even after its requesting application ceases execution. On the other hand, temporary objects are destroyed any time after its requesting application ceases execution; to reduce impact on system utilization, such objects can be destroyed during instances of comparatively lower system utilization, such as at initial program load of the operating system.

In some embodiments, the object mapping 120 contains information used to address each hardware-independent system object. The system objects may be addressable via: object name, object type, and object subtype. Additionally or alternatively, each system object can be addressable via a virtual address 102. When a system object is deleted, its virtual address is no longer valid, and an attempt by an application to access the virtual address results in an object-destroyed exception. Support for the object-destroyed exception permits object access via virtual address while still maintaining integrity of virtual memory accesses and, consequently, integrity of the execution environment provided by the operating system. The virtual addresses referencing the segment pages contain a segment identifier that is de-assigned when the segment is destroyed, thereby rendering the segment virtual addresses invalid and providing support for the object-destroyed exception. The segment identifier can be de-assigned by updating the object mapping 120 to reflect the segment identifier as being de-assigned.

However, destroying the object segments can result in a substantial processing overhead, depending on overall system utilization and further depending on the hardware capabilities of the secondary storage devices. Further, in creating subsequent objects, new segment pages are located in the physical memory 160 and allocated in the storage 170, further increasing the processing overhead. The overhead is further compounded by applications that exhibit certain types of access patterns, such as applications that rapidly open database files during processing. Because each open/close cycle can result in several system objects being created and destroyed, any reduction in the overhead can result in a substantial improvement on system performance.

In one embodiment, a page table 150 is provided that contains mapping information from virtual addresses of the virtual memory 130 to physical addresses of the physical memory 160. A successful lookup of a given virtual address in the page table 150 yields a corresponding physical address having incurred main memory access latency and without having incurred secondary storage processing overhead. On the other hand, an unsuccessful lookup triggers a page fault, whereupon the virtual memory manager component loads a desired page from the storage 170 to the physical memory 160 at a specific articular physical address, thereby incurring secondary storage processing overhead; the page table 150 is updated to reflect the specific physical address. The secondary storage processing overhead can be at least an order of magnitude greater than the main memory access latency.

In some embodiments, a translation lookaside buffer 140 is provided that serves as a cache for the page table 150. The translation lookaside buffer 140 can be implemented in hardware cache memory to provide lower access latency than the page table 150. Depending on the embodiment, this hardware cache memory can reside between a processing unit of a processor and a cache component of the processor; between the processor and main memory; or between different levels of cache components of the main memory. When a lookup of a given virtual address is desired, the virtual memory manager component first checks the translation lookaside buffer 140. A successful lookup of the given virtual address in the translation lookaside buffer 140 yields a corresponding physical address having incurred cache memory access latency and without having incurred main memory access latency. The main memory access latency can be at least an order of magnitude greater than the cache memory access latency. If the lookup is unsuccessful, the virtual memory manager component then performs a lookup in the page table; main memory access latency is incurred if the page table lookup is successful, while secondary storage processing overhead is incurred if the page table lookup triggers a page fault. Whether a page fault is triggered, the corresponding physical address is identified, the translation lookaside buffer is updated to reflect the given virtual address and the corresponding physical address.

Although only a single level of translation from virtual address 102 to physical address 112 is shown in the functional block diagram 100 for illustrative purposes, in alternative embodiments, additional levels of translation of virtual addresses can be performed. In a particular embodiment, an effective virtual address, specific to a process or to the kernel, is translated to a system virtual address specific to the overall system; the system virtual address is then translated to a physical address. The effective virtual address can be smaller in size than the system virtual address and can include an effective segment identifier, a page offset, and a byte offset; the system virtual address can include a virtual segment identifier, a page offset, and a byte offset. The effective virtual address can be translated to the system virtual address via information stored and maintained in a segment table separate from the page table 150. At least in some embodiments, the object mapping 120, the page table 150, and/or the segment table can be stored and maintained in kernel space of the virtual memory 130.

In some embodiments, if the segment pages associated with a deleted object can be retained and reused by a new object that is deemed as compatible, the system utilization can be greatly reduced. However, support for segment reuse should not come at the cost of system behavior that correctly supports object-destroyed exceptions even in instances involving reusable or reused segments. That is, the virtual memory access model including object-destroyed exceptions should be correctly maintained.

In one embodiment, to permit new objects to reuse segment pages of deleted objects, while still maintaining integrity of virtual memory accesses of hardware-independent system objects, the operating system contains a segment recycler component. In a particular embodiment, the segment recycler component can be implemented as a segment recycler subcomponent of the virtual memory component of the operating system kernel. In one embodiment, recycling segment pages refers to rendering the segment pages of a deleted system object available for reuse by a new system object. Although embodiments are described herein with reference to the segment recycler component in particular, in other embodiments, the techniques disclosed herein can be performed by any one or more components or subcomponents of the operating system.

In some embodiments, when a system object is requested to be destroyed, the segment recycler component de-assigns the segment identifier of the system object and remaps the segment pages 162 associated with the base segment of the system object from an old virtual address range 132 to a new virtual address range 136, without reallocating the segment pages 162. The old virtual address range 132 includes the segment identifier, and the new virtual address range 136 includes a new segment identifier. The segment identifier included in the old virtual address range 132 can also be referred to as an old segment identifier or as an initial segment identifier. In some embodiments, each of the old and new segment identifiers can uniquely identify a respective object relative to other objects in the system.

As shown, the segment pages of the base segment are remapped from a contiguous range in virtual memory to another contiguous range in the virtual memory 130. In alternative embodiments, the segment pages of the base segment are remapped from a set of non-contiguous ranges and/or to another set of non-contiguous ranges in the virtual memory 130. Segment pages that are remapped to the new virtual address range 136 may be referred to as being unmapped from, or no longer mapped to, the old virtual address range 132. In some embodiments, such segment pages are referred to as being unmapped from the old virtual address range—regardless of whether the old virtual address range is vacant or occupied by a next set of one or more segment pages.

The segment recycler component then stores, in a reusable segment store 125, the remapped segment pages for subsequent use as a base segment for a newly created object having attributes deemed as being compatible with attributes of the remapped segment pages. The reusable segment store 125, also referred to as a reusable segment cache, can be stored and maintained in kernel space of the virtual memory 130. In some embodiments, only reusable segments of a size identical to a desired segment size for a new object are deemed as being compatible with the new object. In alternative embodiments, reusable segments of a size equal to or greater than the desired segment size are deemed as being compatible; in such cases, reusable segments of a size less than the desired segment size are still deemed incompatible.

In one embodiment, when a base segment is needed for a new object being created, the segment recycler component checks the reusable segment store for existing segment pages that are determined as being compatible with the new object based on a comparison of reusable segment attributes and desired segment attributes for the new object. Examples of desired segment attributes include segment size and what form of storage protection is desired, e.g., read-only in user state (as opposed to elevated state), read-and-write always, read-only always, etc. Other examples of desired segment attributes include whether the accessible portion of the system object contains tagged pointers, whether the accessible portion of the system object contains executable code, and whether the segment is auto-extendable.

In some embodiments, reusable segments in the reusable segment store 125 are organized by slots $127_{1\text{-}2}$. The reusable segment store includes multiple slots, each slot corresponding to a distinct set of segment attribute values. The segment attribute values of the slots can, but need not necessarily pertain to, all of the segment attributes supported by the system. A slot having a particular set of segment attribute values only stores reusable segments having the same set of segment attribute values. In this regard, each slot stores a respective subset of the reusable segments in the reusable segment store. Depending on the embodiment, the total count of slots, the total size of the slots, the sizes of individual slots, and/or the maximum count of reusable segments stored in an individual slot can be dynamically adjusted based on utilization statistics of the slot. The slots can be dynamically reconfigured to store a greater number of reusable segments during instances of comparatively higher utilization and to store a smaller number of reusable segments during instances of comparatively lower utilization.

When the slots are dynamically reconfigured to store a smaller number of reusable segments, a number of reusable segments may need to be destroyed because they can no longer be accommodated by the reconfigured slots. The utilization statistics can be maintained by the virtual memory component via periodic monitoring. In some embodiments, the utilization statistics characterize recent utilization and include a number of gets to the slot since the last monitoring and a number of puts to the slot since the last monitoring. For instance, the segment recycler component can use the statistics to determine that recent demand for segments of a particular slot is comparatively low and, hence, that a number of reusable segments in that particular slot should be destroyed. Doing so permits specific slots in the reusable segment store to expand or contract based on associated slot utilization statistics.

In one embodiment, the segment recycler component can use the segment attributes, along with the identity of the compute node that the application requesting the new object is executing on, to determine whether any segment in the reusable segment store is compatible with the new object. In this regard, the segment recycler component can determine a measure of nodal affinity based on the compute node that the application is executing on and a respective compute node where each reusable segment is stored, and the measure of nodal affinity can be used to prioritize selection of reusable segments having greater nodal affinity with the compute node the application is executing on. Depending on the embodiment, doing so can reduce data access latency of reusable segments by prioritizing reuse by processors having greater nodal affinity within a single, multiprocessing system and/or by processors having greater nodal affinity within a networked system of multiple computers.

If a reusable segment in the reusable segment store 125 is found to be compatible with the new object, the segment recycler component returns the remapped virtual address range 136 of a reusable segment 162 that is recycled from the destroyed object, for reuse by the new object. In some embodiments, prior to returning a new segment, the segment recycler component initializes the new segment for reuse by the new object, by setting or clearing specified values of the new segment. The new segment is assigned as a segment of the new object, after which the new object is identifiable by the new segment identifier of the remapped virtual address range 136. If no reusable segment in the reusable segment store 125 is found to be compatible with the new object, the virtual memory component allocates segment pages of a new segment 164 based on the desired segment attributes and maps a new virtual address range 134 for the allocated segment pages, the new virtual address range including a new segment identifier, thereby incurring processing overhead in memory and/or on disk. When a system object is destroyed, the segment recycler component recycles segment pages of the associated base segment and stores the recycled segment pages based on segment attributes of the base segment. In some embodiments, the segment recycling functionality of the operating system can be selectively enabled or disabled by a user by setting or clearing a segment reuse flag of the operating system; in certain embodiments, the segment reuse flag can only be enabled or disabled by an administrative user of the operating system.

In instances of increased system utilization, the same segment pages can be continually reused as system objects are rapidly created and destroyed, which can result in a dramatic improvement in system performance. In a particular instance of testing segment page reuse, a cursor open/close test created and destroyed over a billion system objects within a number of hours, while the net number of segment pages actually allocated and freed in memory and disk was successfully limited to only a few thousand in number, thereby drastically reducing a processing overhead of de-allocating and re-allocating segment pages corresponding to the billion system objects. Accordingly, the techniques disclosed herein for reusing segment pages maintain integrity of memory addressing, by preserving system behavior that correctly supports object-destroyed exceptions—while enabling performance benefits resulting from improved memory and disk page management.

Figure 2:
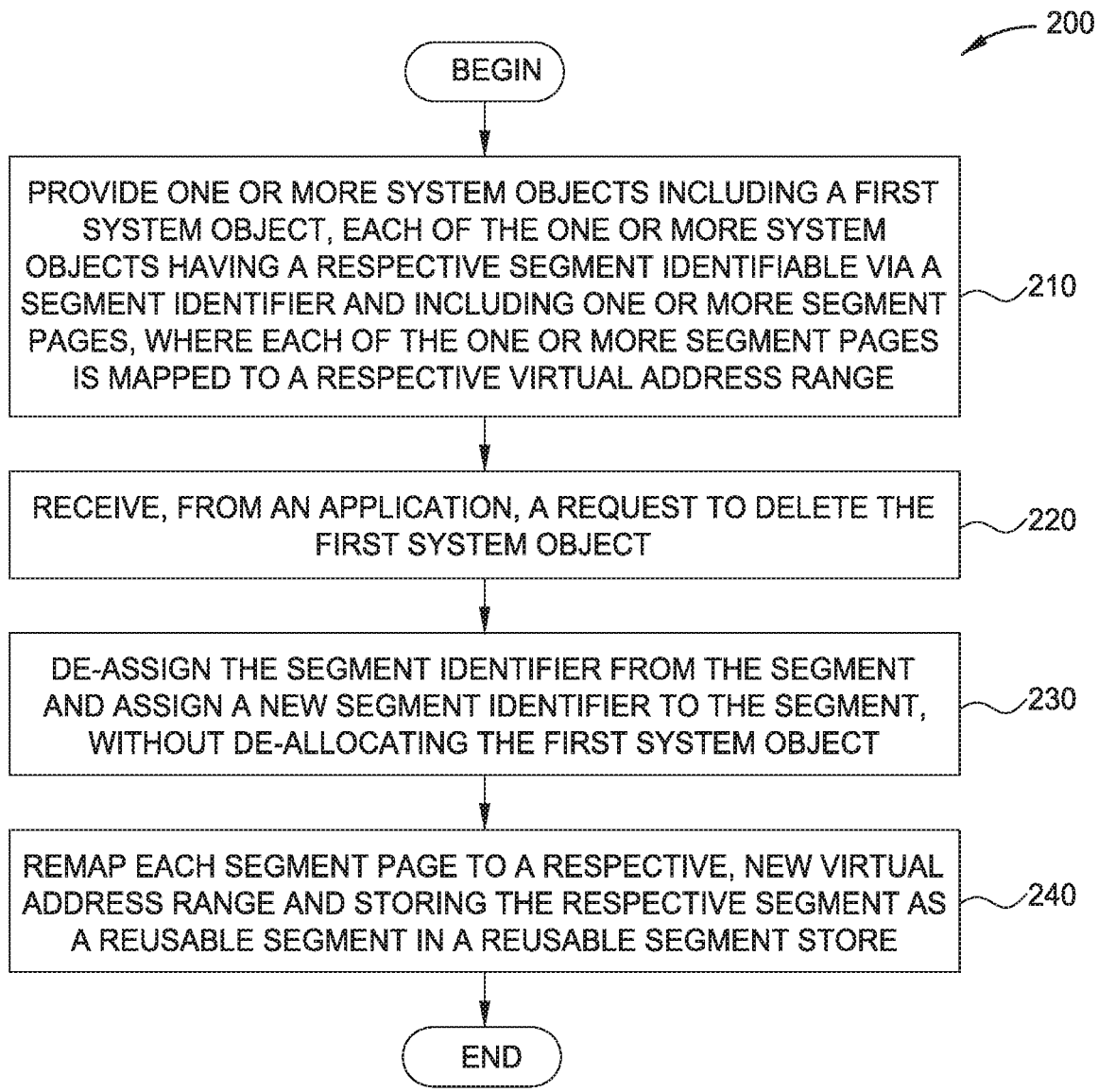
FIG. 2 is a flowchart depicting a method for an operating system to implement increased selectivity in allocating and de-allocating system objects while preserving integrity of memory addressing, according to one embodiment presented in this disclosure.

FIG. 2 is a flowchart depicting a method 200 for the operating system to implement increased selectivity in allocating and de-allocating system objects, without compromising integrity of virtual memory accesses in the execution environment provided by the operating system, according to one embodiment presented in this disclosure. As shown, the method 200 begins at step 210, where the operating system provides one or more system objects including a first system object. Each of the one or more system objects has a respective segment identifiable via a segment identifier and including one or more segment pages. Further, each of the one or more segment pages is mapped to a respective virtual address range. At step 220, the segment recycler component of the operating system receives, from an application, a request to delete the first system object. At step 230, the segment recycler component de-assigns the segment identifier from the segment and assigns a new segment identifier to the segment, without de-allocating the first system object. At step 240, the segment recycler component remaps each segment page to a respective, new virtual address range and stores the respective segment as a reusable segment in the reusable segment store. After the step 240, the method 200 terminates.

Figure 3:
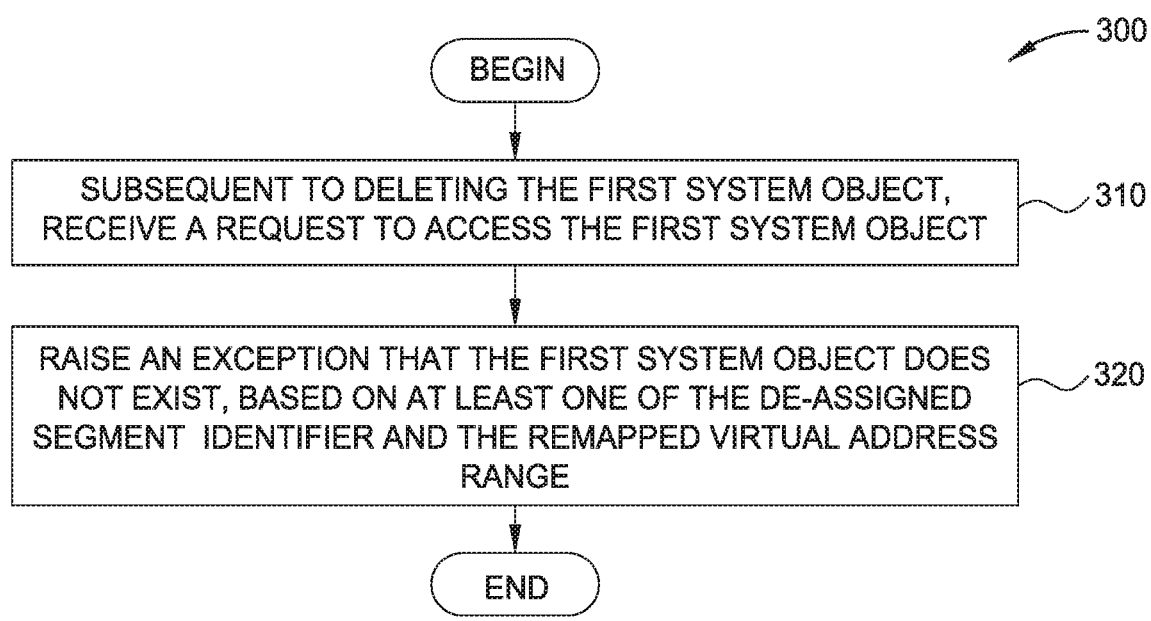
FIG. 3 is a flowchart depicting a method for the operating system to handle an application request to access a deleted system object recycled for reuse, according to one embodiment presented in this disclosure.

FIG. 3 is a flowchart depicting a method 300 for the operating system to handle an application request to access a deleted system object recycled for reuse, according to one embodiment presented in this disclosure. As shown, the method 300 begins at step 310, where the operating system, subsequent to deleting the first system object, receives a request to access the first system object. At step 320, the operating system raises an exception that the first system object does not exist, based on at least one of the de-assigned segment identifier and the remapped one or more segment pages. In alternative embodiments where the operating system receives a request to access a system object that has not been deleted, the operating system can provide access to the system object without raising the exception that the system object does not exist—provided that access requirements, such as security permissions, are met. In some embodiments, different types of exceptions that the first system object does not exist can be raised based on whether the first system object was attempted to be accessed via a de-assigned segment identifier or via a virtual address within the virtual address range that was remapped; in other embodiments, the same type of exception that the first system object does not exist is raised in either case. After the step 320, the method 300 terminates.

Figure 4:
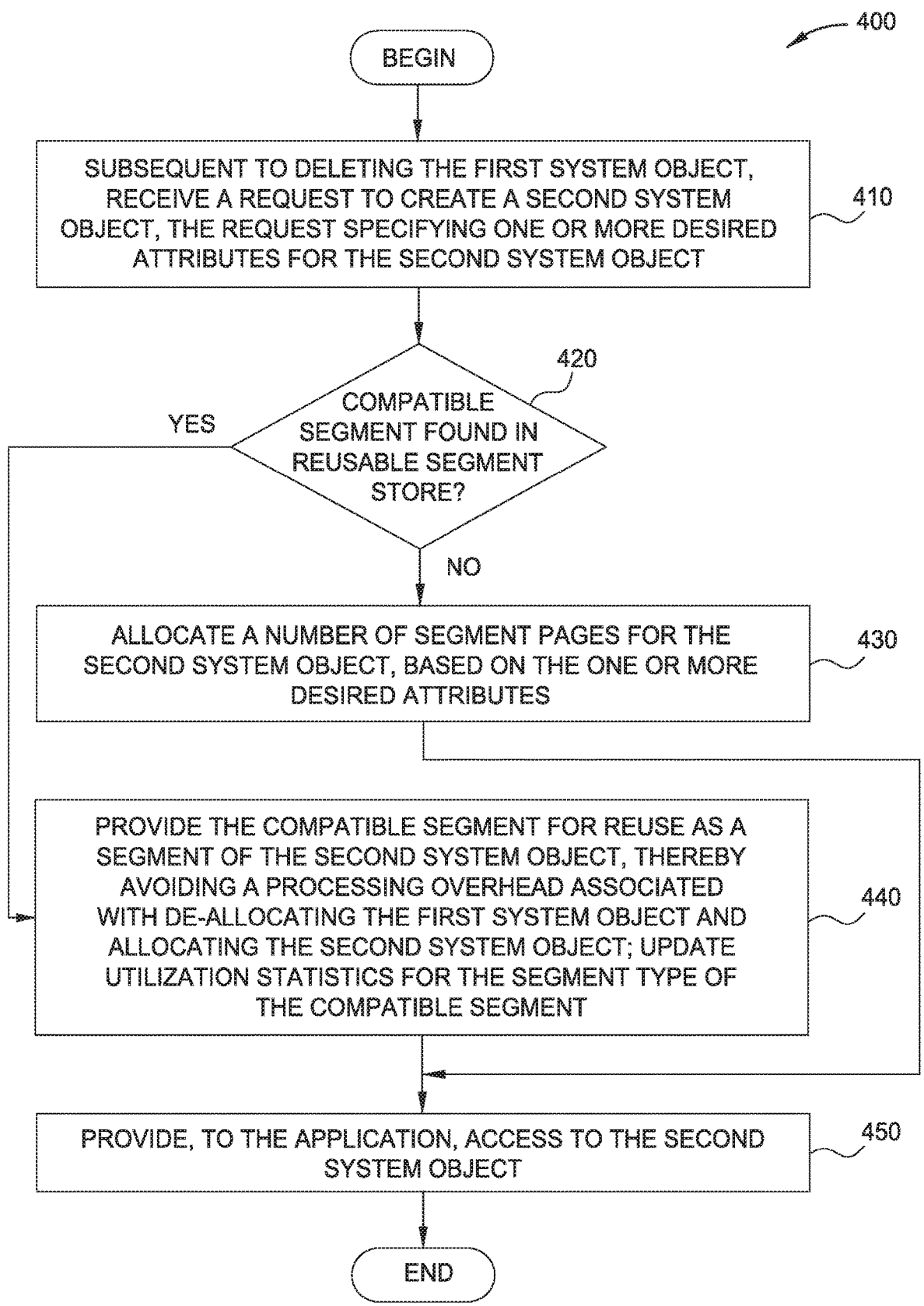
FIG. 4 is a flowchart depicting a method for the operating system to handle an application request to create a new system object, based on a reusable segment store, according to one embodiment presented in this disclosure.

FIG. 4 is a flowchart depicting a method 400 for the operating system to handle an application request to create a new system object, based on the reusable segment store, according to one embodiment presented in this disclosure. As shown, the method 400 begins at step 410, where the operating system, subsequent to deleting the first system object, receives a request to create a second system object. The request specifies one or more desired attributes for the second system object. At step 420, the segment recycler component determines whether a compatible segment exists in the reusable segment store. If so, then at step 440, the segment recycler component provides the compatible segment for reuse as a segment of the second system object, thereby avoiding a processing overhead associated with de-allocating the first system object and/or allocating the second object; utilization statistics for the segment type of the compatible segment can also be updated. Otherwise, at step 430, the operating system allocates a number of segment pages for the second system object, based on the one or more desired attributes. After the step 430 or the step 440, the operating system provides, to the application, access to the second system object at step 450. After the step 450, the method 400 terminates.

Figure 5:
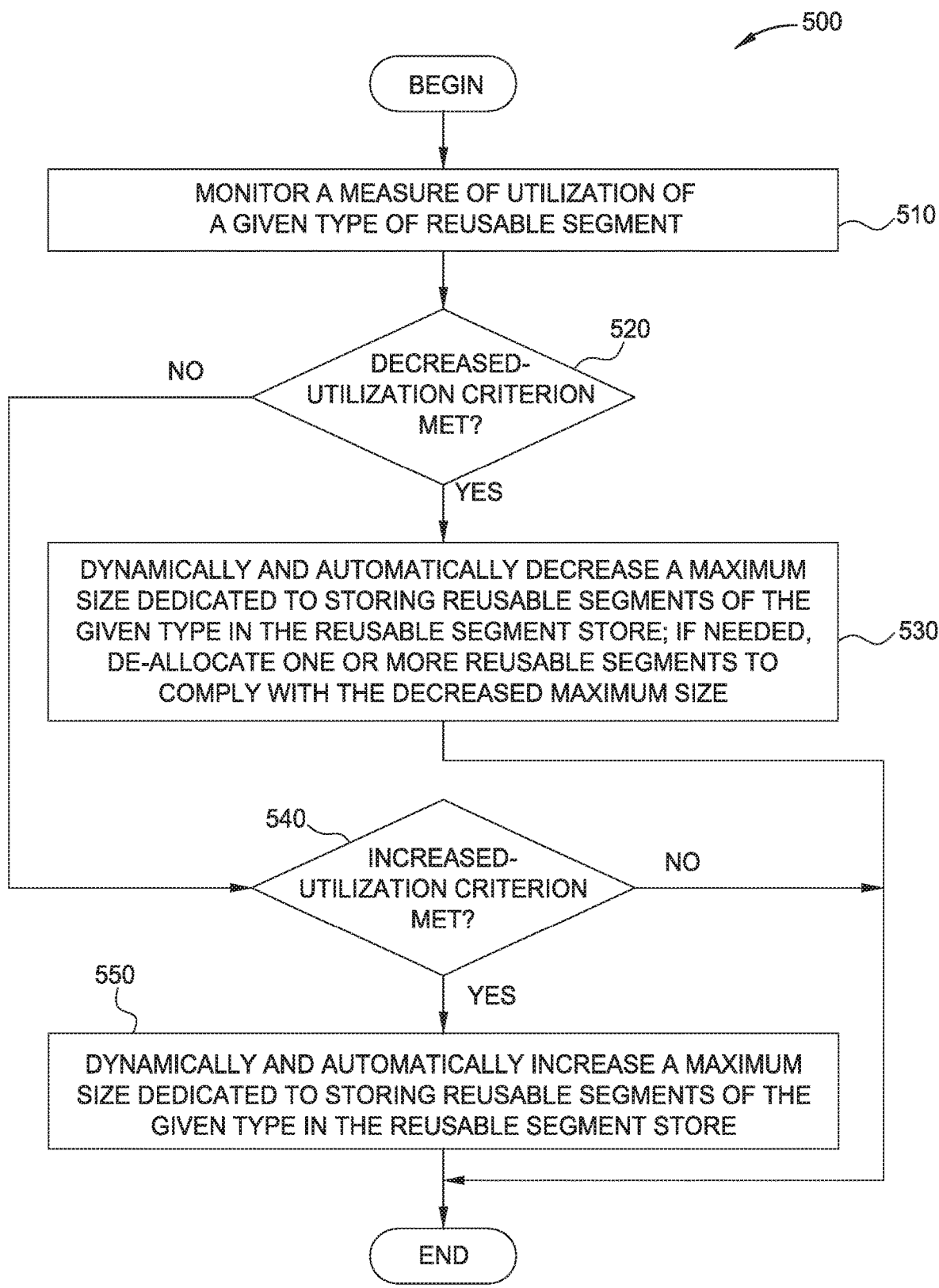
FIG. 5 is a flowchart depicting a method for the operating system to dynamically and automatically adjust a maximum size of the reusable segment store, according to one embodiment presented in this disclosure.

FIG. 5 is a flowchart depicting a method 500 for the operating system to dynamically and automatically adjust a maximum size of the reusable segment store, according to one embodiment presented in this disclosure. As shown, the method 500 begins at step 510, where the segment recycler component monitors a measure of utilization of a given type of reusable segment, e.g., a type of reusable segment corresponding to a specific combination of segment attribute values such as segment size, storage protection, etc. At step 520, the segment recycler component determines whether a decreased-utilization criterion is met. If so, then at step 530, the segment recycler component dynamically and automatically decreases a maximum size dedicated to storing reusable segments of the given type, that are stored in a slot corresponding to the given type in the reusable segment store. If necessary to comply with the decreased maximum size, the segment recycler component can also de-allocate one or more reusable segments of the given type.

By dynamically adjusting the maximum size of a specific slot, the operating system thereby also dynamically adjusts a maximize size of the reusable segment store overall. In an alternative embodiment, the operating system can additionally or alternatively dynamically adjust the maximize size of the reusable segment store directly based on a measure of utilization of the reusable segment store.

At step 540, the segment recycler component determines whether an increased-utilization criterion is met. If so, then at step 550, the segment recycler component dynamically and automatically increases the maximum size dedicated to storing reusable segments of the given type, that are slot corresponding to the given type in the reusable segment store. The size by which the maximum size is increased or decreased can be predefined and tailored to suit the needs of a particular case; in some embodiments, the size may also be defined as a function of segment utilization. After the step 550, the method 500 terminates. Further, if the decreased-utilization criterion is not met (step 520) and the increased-utilization criterion is not met (step 540), then the method 500 also terminates without dynamically increasing or decreasing the maximum size of the slot.

In a particular embodiment, the segment identifier is part of a virtual address that includes a twenty-four-bit segment identifier and an offset that includes both a twelve-bit page offset and a twelve-bit byte offset. The virtual address is mappable to a corresponding physical address, the corresponding physical address including a twenty-four-bit frame number and a twenty-four-bit offset. The virtual and/or physical address components and associated component sizes can be tailored to suit the needs of a particular case.

As described above, an application request for a new system object can specify one or more desired attributes, and the new system object can be of a specific, technology-independent system object type supported by the operating system. Example attributes include object size, storage protection, object permanence, object suspension, object damage, access-group present, object being traced, object under commitment control, object type, object subtype, fixed/variable size, initial value of space, and size of space. Example technology-independent system object types include access group, authorization list, byte-string space, class-of-service description, commit block, context, controller description, cursor, data space, data space index, dictionary, dump space, index, journal port, journal space, logical unit description, mode descriptor, module, network descriptor, process-control space, program, queue, space, and user profile. The attributes and/or system object types can be tailored to suit the needs of a particular case.

In certain embodiments, the operating system supports a configurable measure of granularity of reusing segments, including a first measure of granularity with which individual segment pages of a deleted system object are only reusable by a single object and a second measure of granularity with which individual segment pages of a deleted system object are separately reusable by different objects. Additionally or alternatively, in certain embodiments, each segment page of the base segment of a given system object can only be contiguous in virtual memory relative to other segment pages of the base segment of the given system object; or each segment page of the base segment of the given system object can be non-contiguous in virtual memory relative to other segment pages of the base segment of the given system object.

By implementing selectivity in allocating and de-allocating system objects without compromising integrity of virtual memory accesses on the system, performance of the system can be improved at least relative to alternative approaches that do not implement said selectivity and alternative approaches that implement said selectivity without correctly preserving integrity of virtual memory accesses. Approaches that do not implement selectivity in allocating and de-allocating system objects can yield a greater processing overhead in de-allocating and re-allocating segment pages of base segments of system objects of a given, compatible type, as system objects of the given type are destroyed and created based on application requests such as database accesses. Approaches that do implement said selectivity without correctly preserving integrity of virtual memory accesses comprises the security and stability of the execution environment provided by the operating system.

Figure 6:
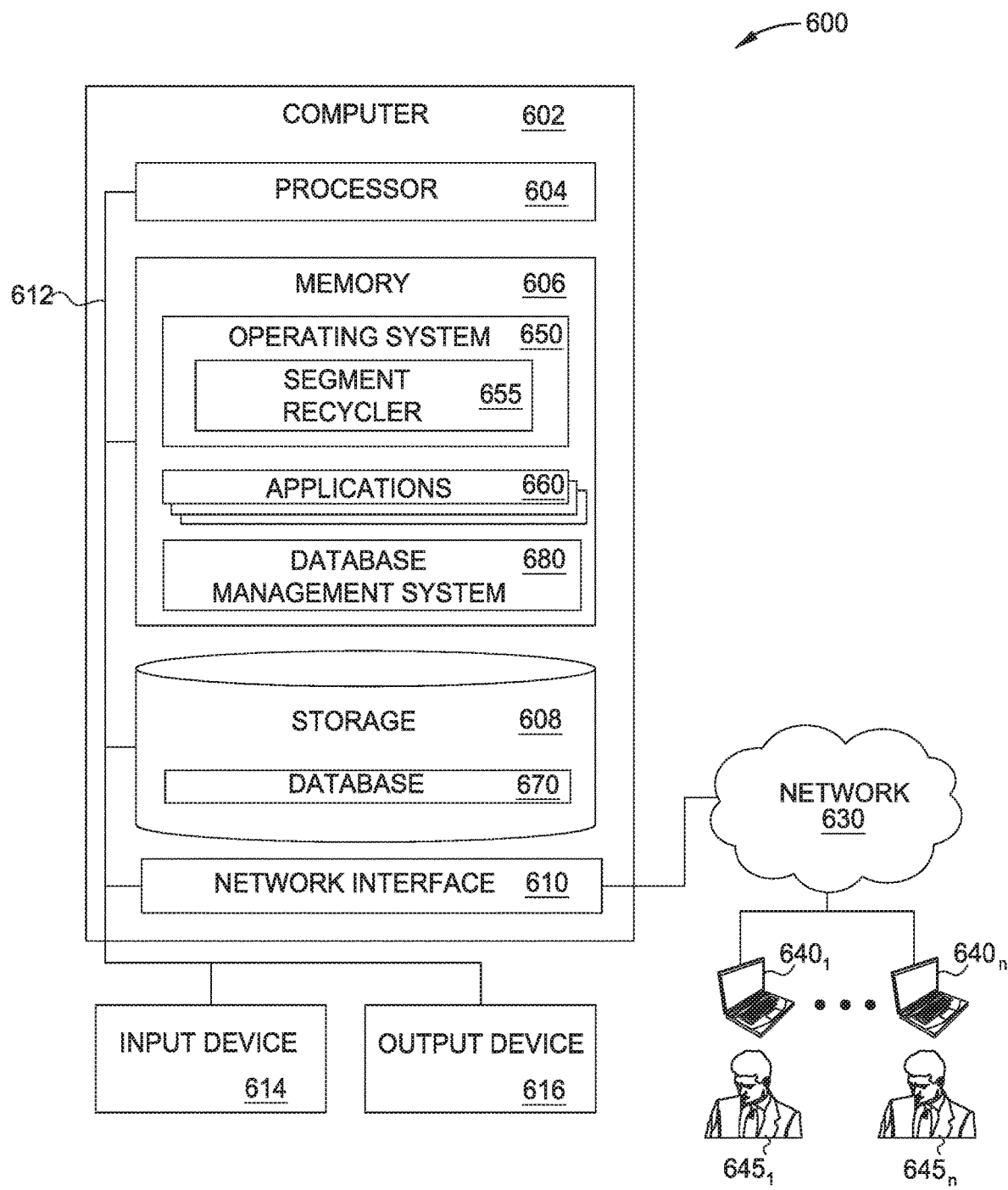
FIG. 6 is a block diagram illustrating hardware components of a system configured to implement increased selectivity in allocating and de-allocating system objects while preserving integrity of memory addressing, according to one embodiment presented in this disclosure.

FIG. 6 is a block diagram illustrating hardware components of a system 600 configured to implement increased selectivity in allocating and de-allocating system objects, without compromising integrity of virtual memory accesses on the system, according to one embodiment presented in this disclosure. The system 600 includes a computer 602 configured to connect to other computers $640_{1-n}$ of associated users $645_{1-n}$ via a network 630. In general, the network 630 may be a telecommunications network and/or a wide area network (WAN). In a particular embodiment, the network 630 is the Internet.

The computer 602 generally includes a processor 604 connected via a bus 612 to a memory 606, a network interface device 610, a storage 608, an input device 614, and an output device 616. The computer 602 is generally under the control of an operating system. Examples of operating systems include UNIX, versions of the Microsoft Windows® operating system, and distributions of the Linux® operating system. More generally, any operating system supporting the functions disclosed herein may be used. The processor 604 is included to be representative of a single CPU, multiple CPUs, a single CPU having multiple processing cores, and the like. Similarly, the memory 606 may be a random access memory. While the memory 606 is shown as a single identity, it should be understood that the memory 606 may comprise a plurality of modules, and that the memory 606 may exist at multiple levels, from high speed registers and caches to lower speed but larger DRAM chips. The network interface device 610 may be any type of network communications device allowing the computer 602 to communicate with the other computers $640_{1-n}$ via the network 630.

The storage 608 may be a persistent storage device. Although the storage 608 is shown as a single unit, the storage 608 may be a combination of fixed and/or removable storage devices, such as fixed disc drives, solid state drives, floppy disc drives, tape drives, removable memory cards or optical storage. The memory 606 and the storage 608 may be part of one virtual address space spanning multiple primary and secondary storage devices.

The input device 614 may be any device for providing input to the computer 602. For example, a keyboard and/or a mouse may be used. The output device 616 may be any device for providing output to a user of the computer 602. For example, the output device 616 may be any conventional display screen or set of speakers. Although shown separately from the input device 614, the output device 616 and input device 614 may be combined. For example, a display screen with an integrated touch-screen may be used.

As shown, the memory 606 of the computer 602 includes an operating system 650 providing an execution environment in which applications 660 and a database management system 680 for a database 670 can execute. The operating system 650 includes a segment recycler component 655 configured with the functionality for increased selectivity in allocating and de-allocating system objects, as disclosed herein. In a particular embodiment, the segment recycler component 655 is a segment recycler subcomponent of a virtual memory component of a kernel of the operating system. The storage 608 includes the database 670. The database management system 680 is configured to process requests from the applications 660 and/or applications executing on other computers on the network 630. By implementing increased selectivity in allocating and de-allocating system objects without compromising integrity of virtual memory accesses on the system 600, performance of the system 600 can be improved at least in some cases.

The descriptions of the various embodiments disclosed herein have been presented for purposes of illustration, but are not intended to be exhaustive or limited to the embodiments disclosed. Many modifications and variations will be apparent to those of ordinary skill in the art without departing from the scope and spirit of the described embodiments.

The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects presented in this disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications or related data available in the cloud. For example, the applications could execute on a computing system in the cloud, where the computing system includes an operating system configured to support recycling segment pages while preserving integrity of memory addressing, according to the techniques disclosed herein. Depending on object access patterns of the applications, the recycling of segment pages can reduce a processing overhead associated with object de-allocation and/or re-allocation, thereby improving the performance of the applications in some cases, at least relative to embodiments in which segment page recycling is unsupported or otherwise disabled. Executing the applications in the cloud permits user access to the related data from any computing system attached to a network connected to the cloud (e.g., the Internet) while still providing improved application performance resulting from segment page recycling.

While the foregoing is directed to embodiments presented in this disclosure, other and further embodiments may be devised without departing from the basic scope of contemplated embodiments, and the scope thereof is determined by the claims that follow.

What is claimed is:

1. A computer-implemented method of implementing selectivity in allocating and de-allocating system objects, without compromising integrity of virtual memory accesses, the computer-implemented method comprising:
  receiving, from an application, a request to delete a first system object having a segment identifiable via an initial segment identifier, the segment including one or more segment pages, wherein each of the one or more segment pages is mapped to a respective, initial virtual address range;
  responsive to the request, de-assigning the initial segment identifier from the segment and assigning a new segment identifier to the segment, without de-allocating the first system object, wherein each segment page is remapped to a respective, new virtual address range, whereafter the segment is stored as a reusable segment in a reusable segment store;
  upon receiving a request to create a second system object, the request specifying one or more desired attributes for the second system object, searching the reusable segment store in order to identify a match satisfying the one or more desired attributes, the match comprising the reusable segment; and
  assigning the reusable segment as a segment of the second system object and by operation of one or more computer processors.

2. The computer-implemented method of claim 1, further comprising:
  providing one or more system objects including the first system object; and
  upon receiving a request to access the first system object, raising an exception that the first system object does not exist, based on at least one of the initial segment identifier being de-assigned and the initial virtual address range being unmapped;
  wherein assigning the reusable segment as the segment of the second system object thereby renders the reusable segment as being reused by the second system object, whereafter the second system object is accessed by the application, thereby avoiding a processing overhead associated with de-allocating the first system object and allocating the second system object, while maintaining integrity of virtual memory accesses of the system objects.

3. The computer-implemented method of claim 2, wherein the computer-implemented method is performed by an operating system, wherein the operating system is configured to, upon no match satisfying the one or more desired attributes being identified, allocate the second system object, whereafter the second system object is accessed by the application, thereby avoiding a processing overhead associated with de-allocating the first system object, while maintaining integrity of virtual addressing of the system objects, wherein each system object comprises a respective, hardware-independent system object supported by the operating system, the operating system additionally supporting hardware-dependent system objects.

4. The computer-implemented method of claim 3, wherein each initial virtual address range includes the initial segment identifier, wherein each new virtual address range includes the new segment identifier, wherein the second system object is uniquely identifiable via the new segment identifier, wherein the operating system is configured to:

only upon determining that a segment reuse flag indicates that segment reuse is enabled, avoid de-allocating the first system object and allocating the second system object, wherein the segment reuse flag is dynamically reconfigurable based on input from an administrative user; and only upon determining that the segment reuse flag indicates that segment reuse is disabled: de-allocate the first system object responsive to the request to delete the first system object; and allocate the second system object responsive to the request to create the second system object.

5. The computer-implemented method of claim 4, wherein the application is selected from a database application and a database management system (DBMS), wherein the reusable segment store includes a plurality of slots, each slot configured to store one or more segment pages, each slot having a maximum slot size, wherein the maximum slot size of each slot is dynamically reconfigurable based on a measure of utilization of the respective slot;

wherein the maximum slot size of a first slot of the plurality of slots is dynamically and automatically decreased upon detecting that the measure of utilization of the first slot satisfies a decreased-utilization criterion, wherein the maximum slot size of a second slot of the plurality of slots is dynamically and automatically increased upon detecting that the measure of utilization of the second slot satisfies an increased-utilization criterion;

wherein the measure of utilization of the first slot is maintained by the operating system.

6. The computer-implemented method of claim 5, wherein in decreasing the maximum slot size of the first slot, one or more reusable segments de-allocated;

wherein the first system object has a system object type defined by a technology-independent machine interface for an underlying processor architecture, wherein the technology-independent machine interface provides a virtual instruction set independent of an underlying machine instruction set of the processor architecture, wherein the technology-independent machine interface comprises a component of an operating system, wherein the technology-independent machine interface is implemented via a plurality of microcode components of the operating system.

7. The computer-implemented method of claim 6, wherein the processing overhead includes a memory overhead and a disk overhead, wherein each segment identifier is part of a virtual address that includes the respective segment identifier and an offset, wherein the offset includes a page offset and a byte offset, wherein each segment identifier is twenty-four bits in length, wherein the page offset is twelve bits in length, wherein the byte offset is twelve bits in length, wherein the virtual address is mappable to a corresponding physical address, the corresponding physical address including a frame number and an offset, wherein the frame number is twenty-four bits in length, wherein the offset of the physical address is twenty-four bits in length.

8. The computer-implemented method of claim 7, wherein the segment comprises a base segment, wherein the operating system supports a configurable measure of granularity of reusing segments, including:

(i) a first measure of granularity with which individual segment pages of a deleted system object are only reusable by a single object; and (ii) a second measure of granularity with which individual segment pages of a deleted system object are separately reusable by different objects;

wherein the first system object includes the base segment and a plurality of secondary segments, wherein in respective instances:

(i) each segment page of the base segment of the first system object can only be contiguous in virtual memory relative to other segment pages of the base segment of the first system object; and (ii) each segment page of the base segment of the first system object can be non-contiguous in virtual memory relative to other segment pages of the base segment of the first system object;

wherein the one or more desired attributes includes: object size, storage protection flag, object permanence, objection suspension, object damage, access-group present, object being traced, object under commitment control, object type, object subtype, fixed/variable size, initial value of space, and size of space;

wherein the one or more desired attributes further includes a first node on which the reusable segment is stored, wherein the match is identified based on a measure of nodal affinity determined between the first node and a second node on which the application is executing;

wherein the first system object has a system object type selected from, in respective instances, cursor and space.

9. The computer-implemented method of claim 1, wherein the computer-implemented method is performed by an operating system configured to, only upon determining that a segment reuse flag indicates that segment reuse is enabled, avoid de-allocating the first system object and allocating the second system object, wherein the segment reuse flag is dynamically reconfigurable based on input from an administrative user.

10. The computer-implemented method of claim 1, wherein the computer-implemented method is performed by an operating system configured to, only upon determining that a segment reuse flag indicates that segment reuse is disabled:

de-allocate the first system object responsive to the request to delete the first system object; and allocate the second system object responsive to the request to create the second system object.

11. The computer-implemented method of claim 1, wherein the reusable segment store has a plurality of slots, each slot configured to store one or more segment pages, each slot having a maximum slot size, wherein the maximum slot size of each slot is dynamically reconfigurable based on a measure of utilization of the respective slot.

12. The computer-implemented method of claim 1, wherein the reusable segment store has a plurality of slots, each slot having a maximum slot size, wherein the maximum slot size of a first slot of the plurality of slots is one of:

dynamically and automatically decreased upon detecting that the measure of utilization of the first slot satisfies a decreased-utilization criterion; and dynamically and automatically increased upon detecting that the measure of utilization of the first slot satisfies an increased-utilization criterion.

13. A computer program product to implement selectivity in allocating and de-allocating system objects, without compromising integrity of virtual memory accesses, the computer program product comprising:

a computer-readable storage medium having computer readable program code embodied therewith, the computer readable program code executable by one or more computer processors to perform an operation comprising:
provide one or more system objects including a first system object, each of the one or more system objects having a respective segment identifiable via an initial segment identifier, the respective segment including one or more segment pages, wherein each of the one or more segment pages is mapped to a respective, initial virtual address range;

upon receiving, from an application, a request to delete the first system object, de-assigning the initial segment identifier from the segment and assigning a new segment identifier to the segment, without de-allocating the first system object, wherein each segment page is remapped to a respective, new virtual address range, whereafter the segment is stored as a reusable segment in a reusable segment store;

upon receiving a request to access the first system object, raising an exception that the first system object does not exist, based on at least one of the initial segment identifier being de-assigned and the initial virtual address range being unmapped;

upon receiving a request to create a second system object, the request specifying one or more desired attributes for the second system object, searching the reusable segment store in order to identify a match satisfying the one or more desired attributes, the match comprising the reusable segment; and assigning the reusable segment as a segment of the second system object, whereby the reusable segment is reused by the second system object, whereafter the second system object is accessed by the application, thereby avoiding a processing overhead associated with de-allocating the first system object and allocating the second system object, while maintaining integrity of virtual memory accesses of the system objects.

14. The computer program product of claim 13, wherein the operation is performed by an operating system configured to, only upon determining that a segment reuse flag indicates that segment reuse is enabled, avoid de-allocating the first system object and allocating the second system object, wherein the segment reuse flag is dynamically reconfigurable based on input from an administrative user.

15. The computer program product of claim 13, wherein the operation is performed by an operating system configured to, only upon determining that a segment reuse flag indicates that segment reuse is disabled:
de-allocate the first system object responsive to the request to delete the first system object; and
allocate the second system object responsive to the request to create the second system object.

16. The computer program product of claim 13, wherein the reusable segment store has a plurality of slots, each slot configured to store one or more segment pages, each slot having a maximum slot size, wherein the maximum slot size of each slot is dynamically reconfigurable based on a measure of utilization of the respective slot.

17. A system to implement selectivity in allocating and de-allocating system objects, without compromising integrity of virtual memory accesses, the system comprising:
one or more computer processors;
a memory containing a program which, when executed by one or more computer processors, performs an operation comprising:
providing one or more system objects including a first system object, each of the one or more system objects having a respective segment identifiable via an initial segment identifier, the respective segment including one or more segment pages, wherein each of the one or more segment pages is mapped to a respective, initial virtual address range;

upon receiving, from an application, a request to delete the first system object, de-assigning the segment identifier from the segment and assigning a new segment identifier to the segment, without de-allocating the first system object, wherein each segment page is remapped to a respective, new virtual address range, whereafter the segment is stored as a reusable segment in a reusable segment store;

upon receiving a request to access the first system object, raising an exception that the first system object does not exist, based on at least one of the initial segment identifier being de-assigned and the initial virtual address range being unmapped;

upon receiving a request to create a second system object, the request specifying one or more desired attributes for the second system object, searching the reusable segment store in order to identify a match satisfying the one or more desired attributes, the match comprising the reusable segment; and assigning the reusable segment as a segment of the second system object, whereby the reusable segment is reused by the second system object, whereafter the second system object is accessed by the application, thereby avoiding a processing overhead associated with de-allocating the first system object and allocating the second system object, while maintaining integrity of virtual memory accesses of the system objects.

18. The system of claim 17, wherein the program comprises an operating system configured to, only upon determining that a segment reuse flag indicates that segment reuse is enabled, avoid de-allocating the first system object and allocating the second system object, wherein the segment reuse flag is dynamically reconfigurable based on input from an administrative user.

19. The system of claim 17, wherein the program comprises an operating system configured to, only upon determining that a segment reuse flag indicates that segment reuse is disabled:
de-allocate the first system object responsive to the request to delete the first system object; and
allocate the second system object responsive to the request to create the second system object.

20. The system of claim 17, wherein the reusable segment store has a plurality of slots, each slot configured to store one or more segment pages, each slot having a maximum slot size, wherein the maximum slot size of each slot is dynamically reconfigurable based on a measure of utilization of the respective slot.

* * * * *